United States Patent [19]

Aikawa et al.

[11] Patent Number: 5,338,328
[45] Date of Patent: Aug. 16, 1994

[54] APPARATUS OF MANUFACTURING HERMETIC COATING OPTICAL FIBER

[75] Inventors: Haruhiko Aikawa; Yoichi Ishiguro; Toshio Danzuka, all of Yokohama, Japan

[73] Assignee: Sumitomo Electric Industries, Ltd., Osaka, Japan

[21] Appl. No.: 149,654

[22] Filed: Nov. 9, 1993

Related U.S. Application Data

[62] Division of Ser. No. 897,753, Jun. 12, 1992.

[30] Foreign Application Priority Data

Jun. 12, 1991 [JP] Japan .................. 3-139903
Sep. 4, 1992 [JP] Japan .................. 4-88641

[51] Int. Cl.⁵ ................................. C03B 37/023
[52] U.S. Cl. ................................. 65/530; 65/27; 65/532; 65/484; 65/507; 65/510; 118/718
[58] Field of Search ............. 65/3.11, 12, 3.12, 27, 65/11.1, 13, 21.3; 118/718

[56] References Cited

U.S. PATENT DOCUMENTS 3,398,023 8/1968 Jacobsen et al.
3,775,074 11/1973 Russell ............................ 65/2
4,473,599 9/1984 Elion ............................ 427/163
4,575,463 3/1986 Biswas et al. .................. 65/3.11 X
4,597,986 7/1986 Scapple et al. ............... 118/50.1 X
5,000,541 3/1991 DeMarcello et al. .......... 427/163 X
5,043,001 8/1991 Cain et al. ..................... 65/3.11 X
5,171,609 12/1992 Ury .............................. 118/50.1 X
5,256,177 10/1993 Bennett et al. ................ 65/3.11

FOREIGN PATENT DOCUMENTS 0308143 3/1989 European Pat. Off.
2145462 6/1990 Japan.
8600938 2/1986 PCT Int'l Appl.

Primary Examiner—Robert L. Lindsay
Attorney, Agent, or Firm—Cushman, Darby & Cushman

[57] ABSTRACT

A mass production method and apparatus of hermetic coating optical fiber where a bare fiber drawn from a preform is hermetically coated by CVD method in a reactor vessel, wherein a liquid flushes solid particles or by-products sticking to the reactor inner wall. The liquid may be supplied continuously or intermittently, to flush carbon particles generated during carbon coating process. The invention enables to produce a long hermetic coating optical fiber without choking the reactor, and improves a yield rate and productivity.

19 Claims, 8 Drawing Sheets

APPARATUS OF MANUFACTURING HERMETIC COATING OPTICAL FIBER

This is a division of application Ser. No. 07/897,753, filed Jun. 12, 1992 which was allowed on Sep. 22, 1993.

BACKGROUND OF THE INVENTION

1. Field of the Invention

The present invention relates to a method and an apparatus for manufacturing a hermetic coating optical fiber, and more particularly to such a method and an apparatus suitable for mass production.

2. Related Background Art

A hermetic coating for an optical fiber is an effective to prevent ambient gases such as water, hydrogen etc. from adhering to the optical fiber or permeating through the optical fiber. Generally, inorganic materials such as metals including alloys and carbon etc. are used as coating materials. Above all, carbon coating is one of the most excellent ones in term of its chemical stability and fine grained structure etc. and one of the coating processes is chemical vapor deposition (CVD) process in which reactant gas reacts chemically to deposit coating material on the optical fiber surface, because it is advantageous in terms of coating speed and quality of the layer.

Conventional apparatuses for performing the above mentioned technologies, are described, for example, in U.S. Pat. No. 4,790,625 or European Patent Application No. 0,308,143. In those apparatuses or methods, the reactor vessels typically have a seal gas inlet port, reactant gas inlet port and waste gas discharge port from the upper to the lower. And a formed fiber of high temperature is hermetic-coated thermo-chemically in the reactor vessel between the reactant gas inlet port and the waste gas discharge port.

Usually in those processes, an optical fiber is drawn from a preform in a draw furnace, before it is provided with hermetic coating. The temperature (about 1300° C.) necessary for formation of the coating particles at the fiber surface maintained at the fiber surface without the need for additional heating means.

In those conventional apparatuses, solid particles such as carbon generated in a vapor phase tended to be deposited on the inner wall, of the reactor vessel. When a fiber was tried to be coated in a long length, the solid particles gradually are deposited on the inner wall of the reactor vessel so that the vessel is clogged in a long period of time requiring the process. Consequently, fiber forming becomes impossible. Without solving the problem, a yield rate of the optical fiber could not be improved and high productivity could not be attained.

SUMMARY OF THE INVENTION

It is an object of the present invention, to eliminate the above mentioned drawbacks of the prior art.

It is further object of the present invention to develop an effective method for manufacturing a hermetic coating optical fiber in a long length.

It is more further object of the present invention to provide an apparatus to manufacture a hermetic coating optical fiber in a long length, avoiding deposition of solid particles on an inner wall of a reactor vessel.

To realize the above-described object, the present invention provides a method and an apparatus of manufacturing a hermetic coating optical fiber, wherein an inner wall of a reactor vessel is flushed and/or washed off by a liquid. The liquid prevents solid particles from sticking to an inner wall of the reactor vessel and/or removes solid particle layer formed on the inner wall of the vessel.

It is further object of the present invention to provide a method of manufacturing a hermetic coating optical fiber comprising the steps of introducing a drawn bare fiber for an optical fiber into a reactor vessel supplying a reactant gas to the reactor vessel coating a thin coating layer on the bare fiber by CVD process and flowing a liquid on an inner wall of the reactor vessel.

It is further object of the present invention to provide an apparatus for manufacturing a hermetic coating optical fiber comprising; a reactor, a reactant gas introducing means connected to the reactor for introducing a reactant gas into said reactor, and liquid flowing means connected to said reactor for flowing a liquid along an inner wall of said reactor, whereby material derived from the reactant gas is hermetically coated on an optical fiber passing through said reactor by chemical reaction.

It is further object of the present invention to provide an apparatus of manufacturing a hermetic coating optical fiber comprising: a reactor vessel, an upper seal gas inlet port provided at the top part of the reactor vessel, a reactant gas inlet port arranged below the upper seal gas inlet port, a reservoir provided below the reactant gas inlet port, a liquid inlet port connected with the reservoir, a weir for causing the liquid in the reservoir to overflow thereover to the inner wall reactor vessel, a lower seal gas inlet port arranged at a bottom part of the reactor vessel, a waste gas discharge port arranged at a bottom part of the reactor vessel, a waste gas treating apparatus provided at a downstream of the waste gas discharge port a waste liquid discharge port arranged at a bottom part of the reactor vessel, and a waste liquid treating apparatus which is at a downstream of the waste liquid discharge port and the reactor vessel being constructed so that an optical fiber passes through.

It is further object of the present invention to provide an apparatus of manufacturing a hermetic coating optical fiber comprising a reactor vessel an upper seal gas inlet port installed at the top part of the reactor vessel, a reservoir provided below the upper seal gas inlet port, the reservoir having a bottom plate and a fiber protective pipe, the bottom plate having a hole through which the liquid tempolay stored in the reservoir flows out to the reactor vessel, a liquid inlet port connected with the reservoir a reactant gas inlet port arranged below the reservoir, a lower seal gas inlet port arranged at a bottom part of the reactor vessel, a waste gas discharge port arranged at a bottom part of the reactor vessel a waste gas treating apparatus provided at a downstream of the waste gas discharge port, a waste liquid discharge port arranged at a bottom part of the reactor vessel, and a waste liquid treating apparatus which is furnished at a downstream of the waste liquid discharge port and the reactor vessel is constructed so that an optical fiber passes through.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
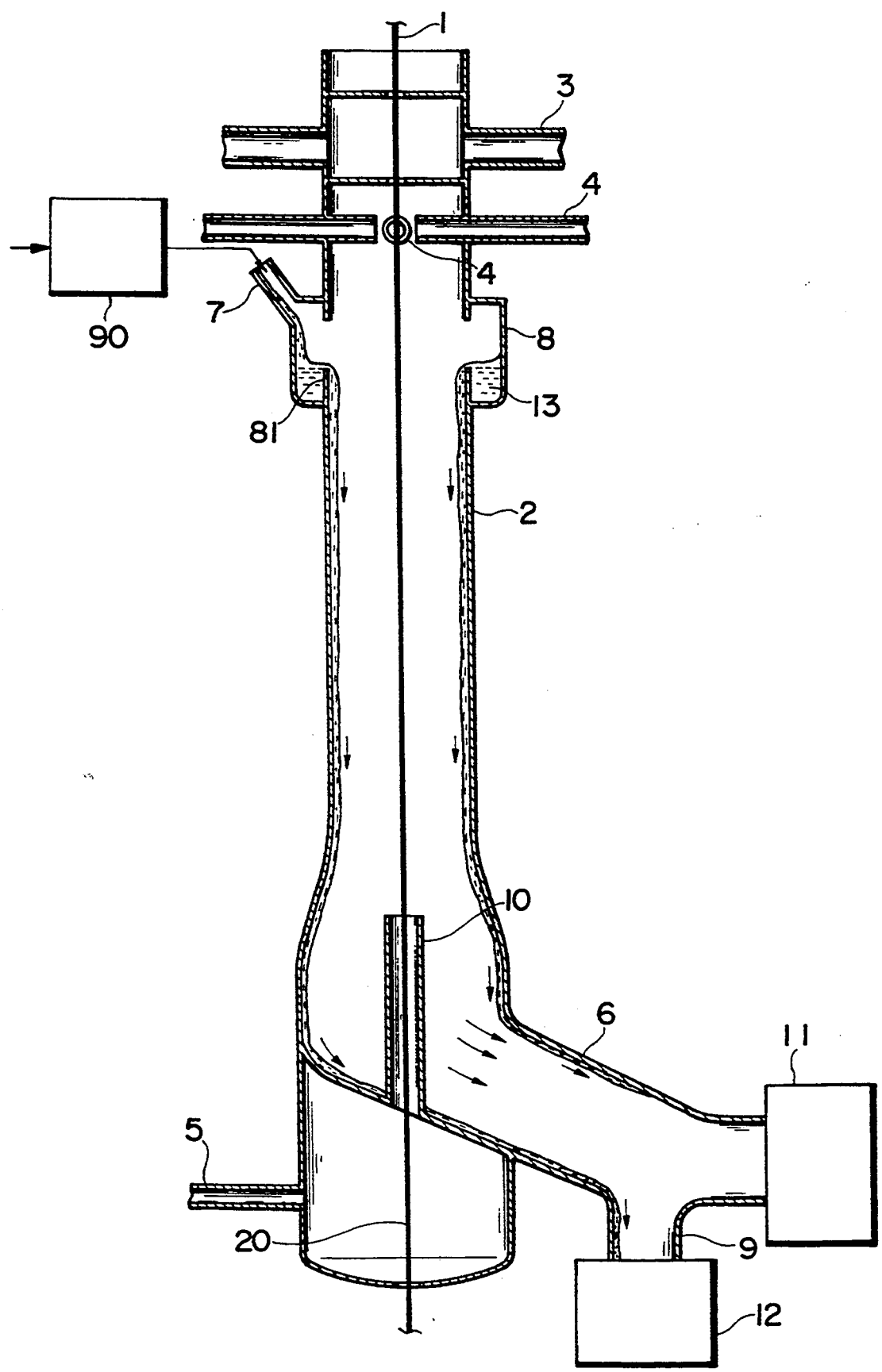
FIG. 1 shows a basic structure of an embodiment of the present invention.

As shown in FIG. 1, a reactor vessel 2 is provided with an upper seal gas inlet port 3, a reactant gas inlet port 4 (reactant gas is supplied to the reactor vessel from 4 directions), a waste gas discharge port 6 and a lower seal gas inlet port 5 respectively in this order from the upper to the lower.

The reactor vessel 2 is furnished with a liquid inlet port 7 for introducing a liquid 13 which prevents solid particles from sticking to an inner wall of the reactor vessel and/or removes solid particle layer deposited on the inner wall of the vessel, and a reservoir 8 for keeping the liquid 13, at the upper part of the reactor vessel. The reactor vessel 2 is also furnished with a waste liquid discharge port 9 and a waste liquid treating apparatus 12 at the lower part thereof. Those elements are made of quartz glass or the like.

The liquid 13 is supplied to the reservoir 8 through the liquid inlet port 7 continuously or intermittently at an optional interval. The accumulated liquid overflows a weir 81 to the inner wall of the reactor vessel 2, uniformly along the circumference of the inner wall, and the liquid 13 flows down on the inner wall. In this process, the liquid 13 takes in particles formed in a vapor phase process which are going to stick to the inner wall of the reactor vessel, and quickly discharges the particles out of the reactor vessel. Where the liquid 13 is supplied intermittently, the particles are supposed to be flushed away after the particles once deposited to form a solid particle layer.

The weir 81 is formed as horizontally as possible so that the liquid 13 overflows the weir supplied uniformly along all over the circumference of the inner wall of the reactor. In addition, the top ridge of the weir may be indented as saw teeth, to distribute the liquid uniformly. A plurality of small holes may be provided circumferentially at the bottom of the weir 81, through which the liquid 13 can flow out to be supplied to the inner wall. In this embodiment, the liquid introduced through the liquid inlet port 7 must flow out through the small holes first and there after the surplus overflows the weir 81. Even when the supply of the liquid through the inlet port 7 is stopped, the liquid retained in the reservoir 8 is continued to flow out to the inner wall of the reactor vessel 2 through the small holes for a while.

The waste liquid is discharged through the waste liquid discharge port 9 to the waste liquid treating apparatus wherein the waste liquid is treated. The liquid reclaimed in the waste liquid treating apparatus 12 may be recycled, or it is possible to construct a circulating system. An exhaust or waste gas is evacuated after it is discharged through the waste gas discharge port 6 to the waste gas treating apparatus 11 and is treated there. A protective pipe 10 should preferably be furnished for the fiber not to come in contact with the waste. Reference numeral 20 denotes the hermetic coating fiber.

Figure 2:
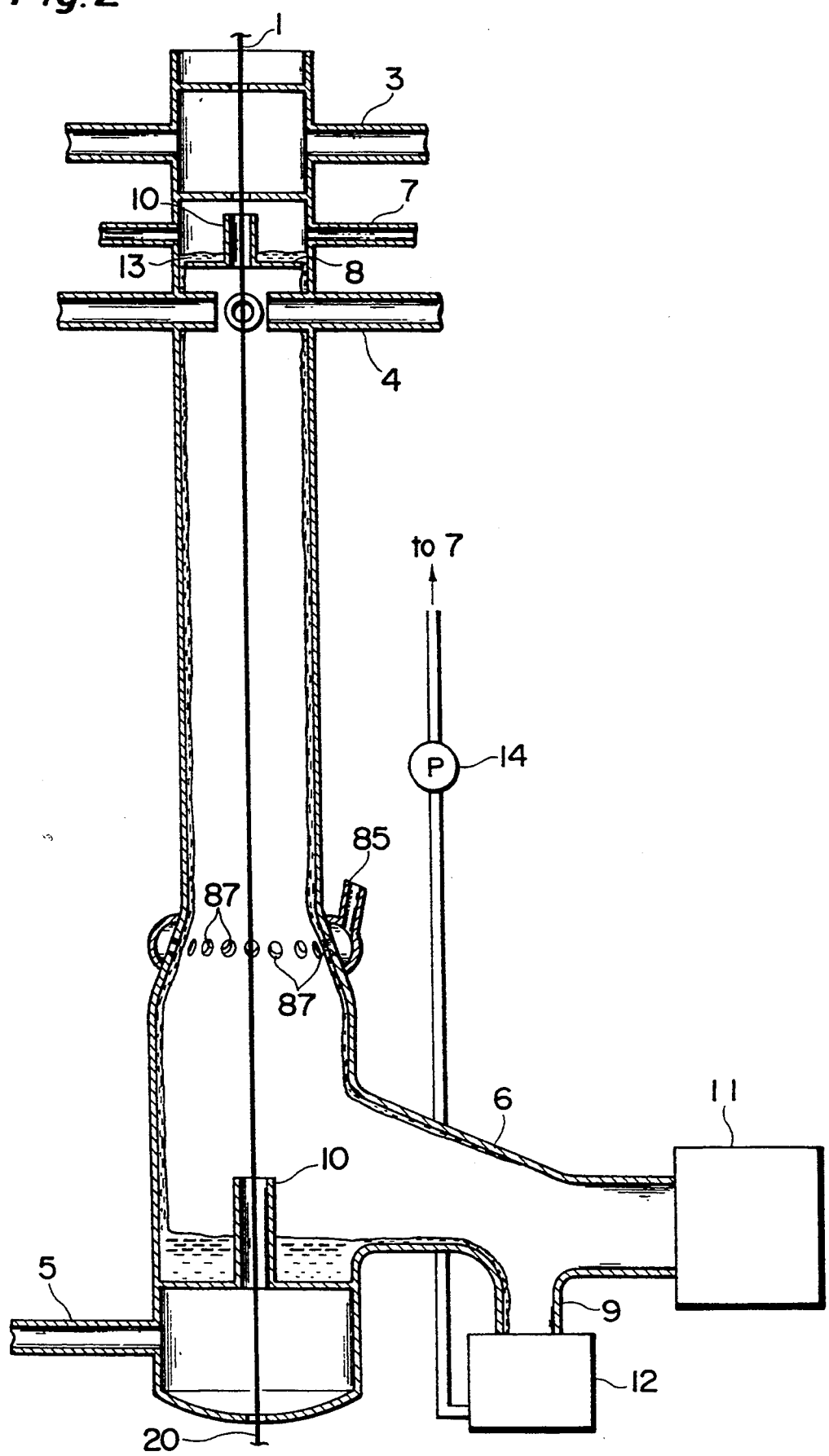
FIG. 2 shows a basic structure of another embodiment of the present invention.

Another embodiment of the present invention is shown in FIG. 2. In the same way as in the embodiment of FIG. 1, a body of a reactor vessel 2 is provided with an upper seal gas inlet port 3, a reactant gas inlet port 4, a waste gas discharge port 6 and a lower seal gas inlet port 5 respectively in this order from the upper to the lower.

The reactor vessel 2 is also furnished with a waste liquid discharge port 9 and a waste liquid treating apparatus 12 in the same manner of the embodiment shown in FIG. 1. The liquid inlet port 7 and the reservoir 8 are furnished above the reactant gas inlet port 4 differently from the embodiment of FIG. 1. With this construction, most part of the inner wall of the reactor vessel 2, which is exposed to the reactant gas, can be covered with the liquid.

Figure 5:
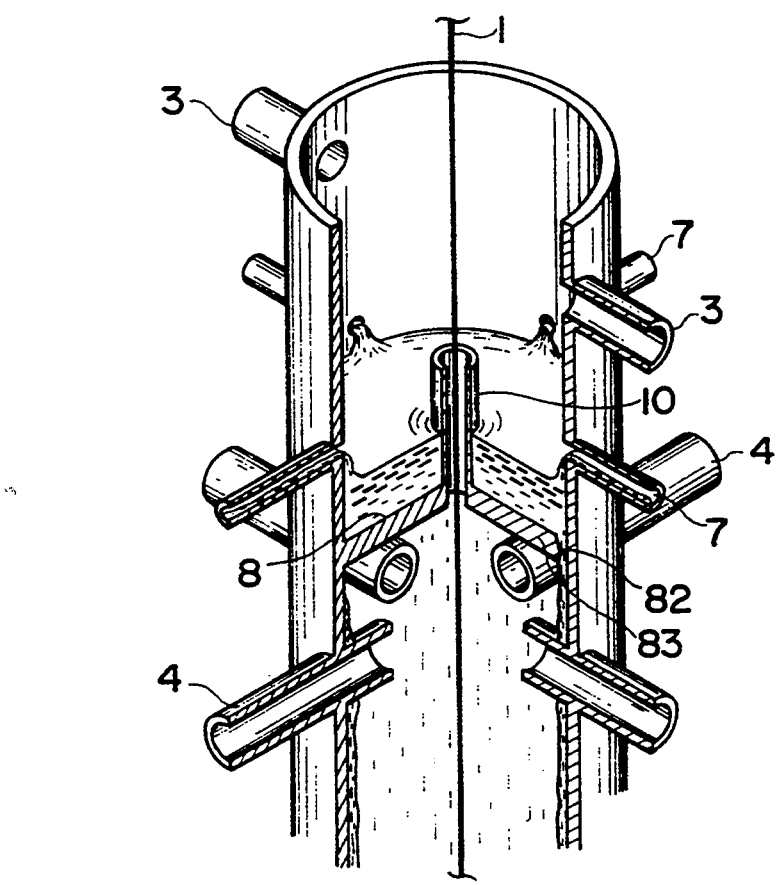
FIG. 5 is a perspective view showing a partial cutaway of the embodiment of FIG. 2.

In this embodiment, the liquid 13 introduced through the liquid inlet port 7 is retained in the reservoir 8. As shown in FIGS. 2 and 5, a fiber protective pipe 10 is installed at the opening of the bottom plate 83 of the reservoir 8, through which the fiber passes. The protective pipe 10 is provided for retaining the liquid in the reservoir and also for preventing the fiber from coming in contact with the liquid. The liquid passing holes 82 are arranged at the periphery of plate 83, along the inner wall of the reactor vessel 2. The liquid flowing out through the holes 82 covers the inner wall of the reactor vessel 2 uniformly.

Figure 6:
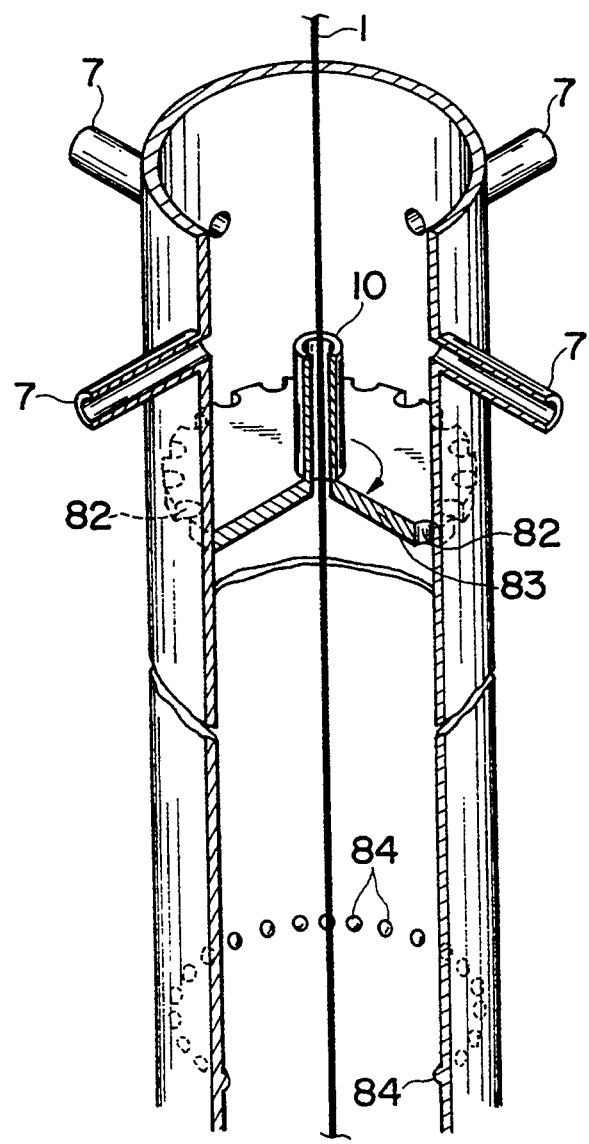
FIG. 6 is a perspective view showing a partial cutaway of another embodiment of FIG. 2.

The bottom plate 83 may be formed separate from the reactor vessel 2 and may be turned relatively against the reactor vessel 2 as shown by an arrow in FIG. 6. The rotation facilitates uniform distribution of the liquid flowing down the inner wall. There are four liquid inlet ports 7 in the embodiments shown in FIGS. 2 and 5 and 6, but one port is acceptable since the liquid is kept in the reservoir once. The liquid passing holes are usually plural, but one is acceptable where the bottom plate 83 turns.

Figure 7:
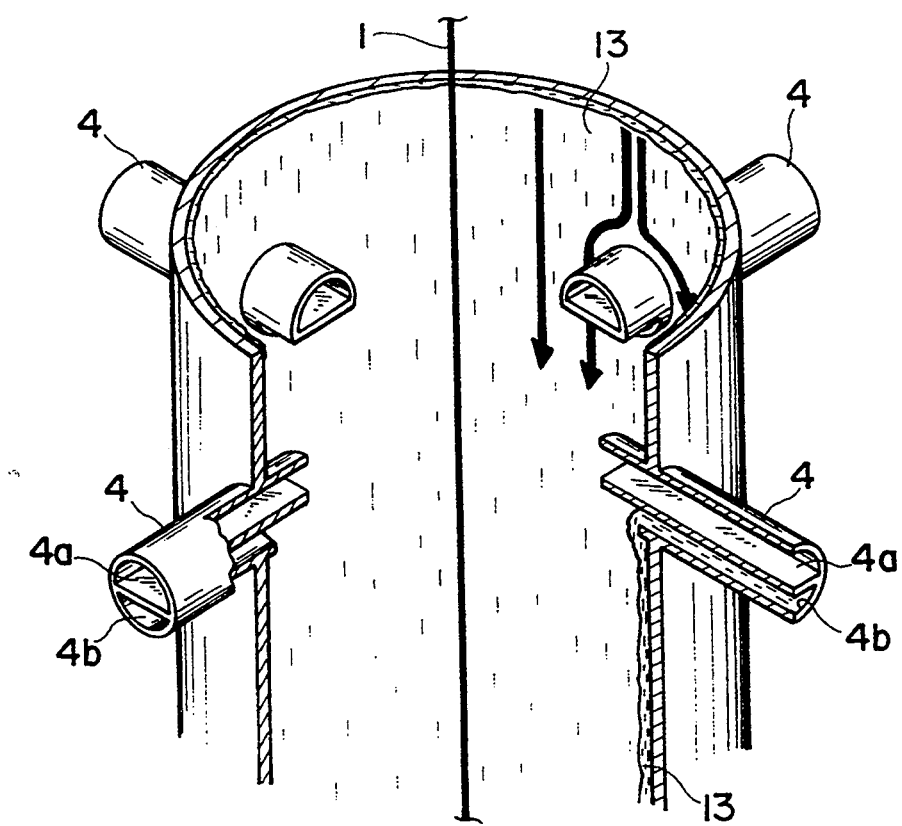
FIG. 7 is a perspective view showing a partial cutaway of the other embodiment of the present invention.

In the embodiment of FIG. 2, most part of the inner wall is covered with the liquid but the part under the reactant gas inlet port 4 may be directly exposed to the gas because the port 4 makes the part blind against liquid flow. A dual pipe may be used to eliminate such a blind part as shown in FIG. 7, wherein the reactant gas flows through the upper path 4a of the dual pipe and the liquid 13 flows through the lower path 4b.

Generally, liquid flowing down a vertical wall is apt to gradually gather into a few stripes of stream, as it goes down. It is because the flow speed becomes higher and the thickness of liquid flow becomes too thin to keep a flat layer of flow, and surface tension also acts to make the liquid surface as small as possible. Also in the present invention, the liquid 13 flows uniformly on the inner wall just after flowing out from the reservoir 8 will gradually lose the uniformity. A weir and redistributing means 84 may be furnished as shown in FIG. 6 to prevent liquid from gathering and losing uniformity. The weir and redistributing means 84 interrupts the liquid flow to suppress the speed and disturbs the liquid stream on the inner wall to make it restore uniformity. The weir and redistributing means 84 may be formed as a series of small projections continuously arranged along the periphery direction of the inner wall as shown in FIG. 6, or may be a uniform weir a little extruded from the wall. The flow of the liquid may be interferred once and overflow again through the weir.

Figure 8:
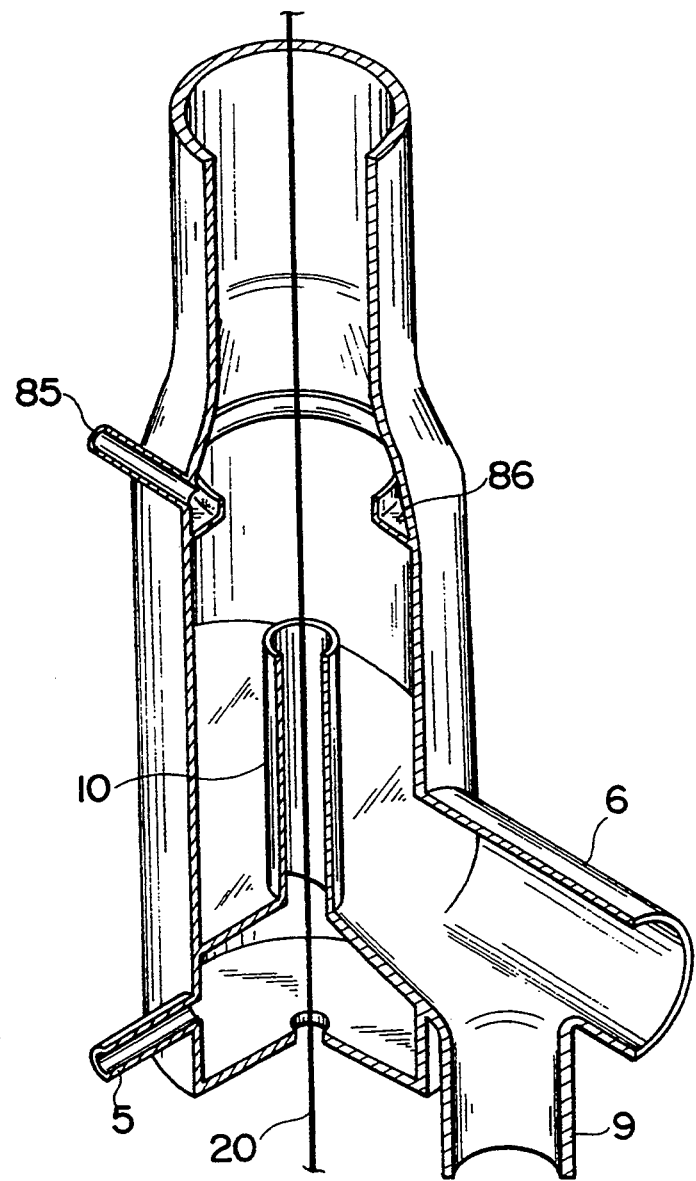
FIG. 8 is a perspective view showing a partial cutaway of the other embodiment of the present invention.

Solid particles generated in a gas phase are easy to deposit on the inner wall where the reactant gas stagnates in the reactor vessel. The bottom part of the reactor vessel is a place where the gas tends to stagnate, and the liquid stream layer tends to be thin, and solid particles are apt to deposit much. In order to prevent it, a second liquid inlet port 85 and a second reservoir 86 may be furnished at the bottom part of the reactor vessel as shown in FIG. 8. In place of the second reservoir 86, a liquid hole 87 may be furnished as shown in FIG. 2.

Figure 3:
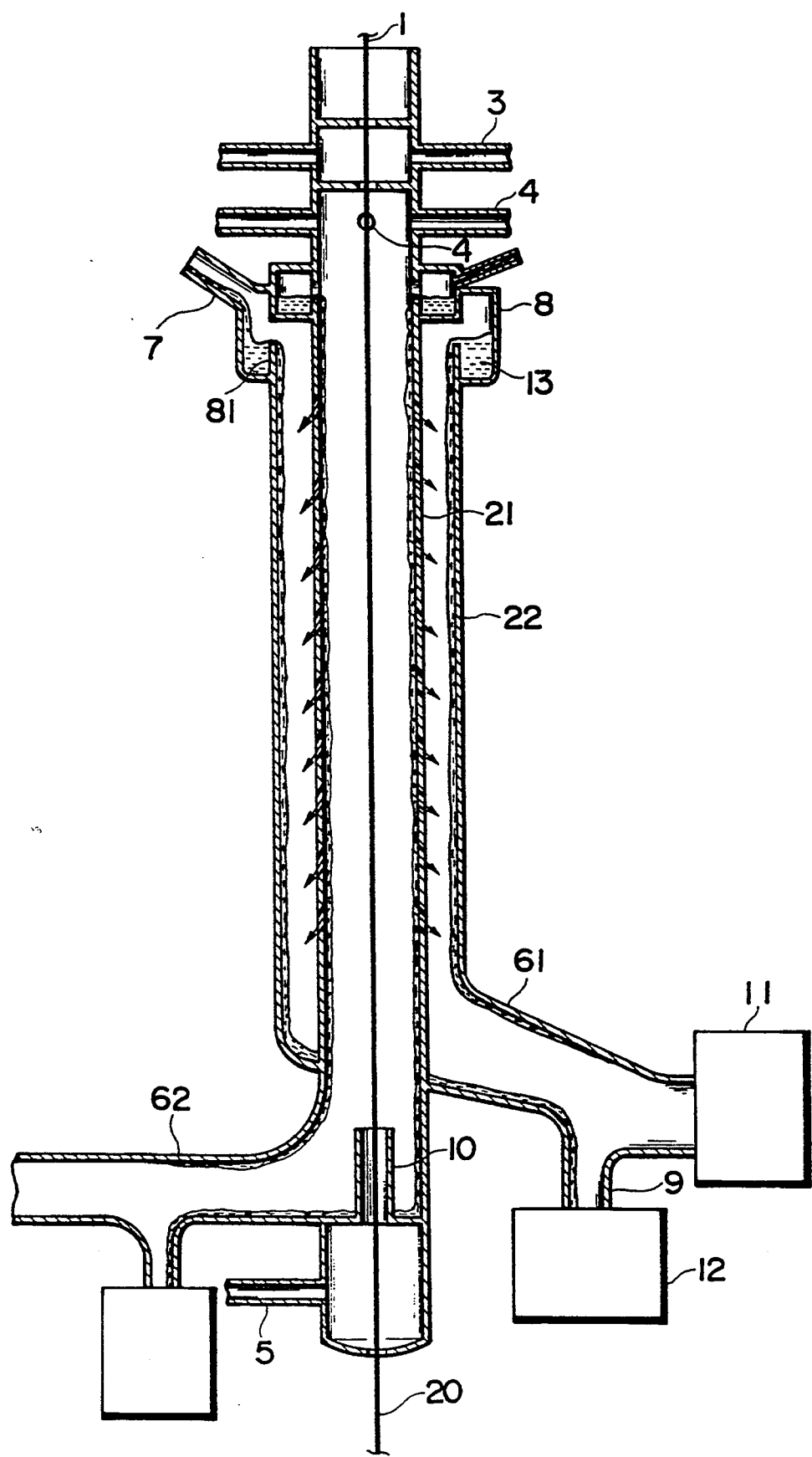
FIG. 3 is an outline showing the other embodiment of the present invention.
Figure 4:
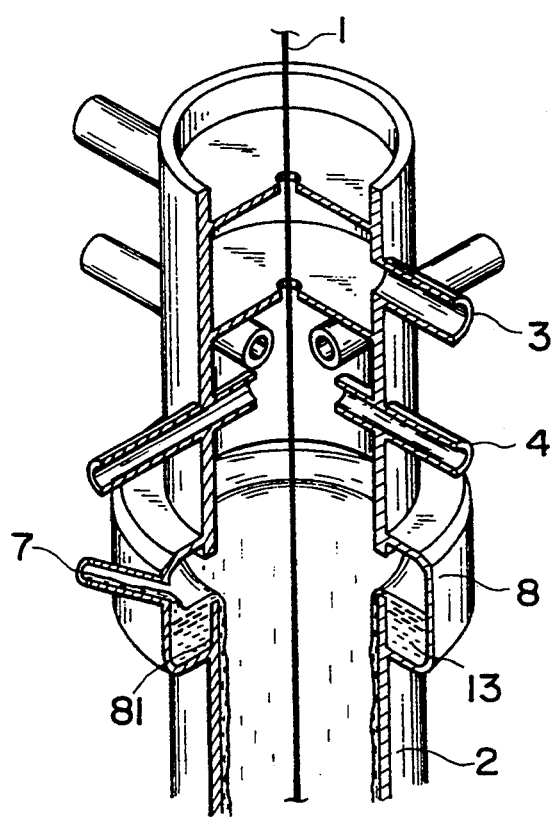
FIG. 4 is a perspective view showing a partial cutaway of the embodiment of FIG. 1.

In order to prevent liquid splashes from coming in contact with the fiber to damage it, and also keep a constant flow of liquid, an apparatus as shown in FIG. 3 is effective. An inner pipe of a reactor vessel is denoted by reference numeral 21 and an external pipe is by 22. The inner pipe is provided with a plurality of openings, which are preferably small to prevent liquid from splashing to the fiber. This embodiment is especially effective when the liquid flows intermittently and the flow rate is high, consequently many splashes are easy to be generated. Usually a small amount of liquid is supplied continuously to the inner pipe, although the gas will not stagnate in the inner pipe and only a small amount of solid particles would deposit on it even without the liquid supply.

The reservoir 8 is provided with holes of about 0.5 to 3 mm in diameter and a few to more than ten in number at the bottom, along the inner wall of the reactor vessel. The liquid supplied through the holes flows uniformly on the inner wall of the reactor vessel. The liquid may overflow the weir 81. A protective pipe 10 is provided for preventing the liquid from coming in contact with the optical fiber and also forming a reservoir.

In the present invention, a liquid with relatively low viscosity may be used when the liquid is supplied intermittently. In this event, solid particle layer which deposited once on the inner wall is flushed away and sometimes a rigidly sticked layer could not be removed. The sticked layer is at most a few mm thick and is not very big trouble.

When the liquid is supplied continuously, a liquid with relatively high viscosity may preferably be used to prevent the liquid from splashing regularly. In this event, the inner wall of the reactor vessel is always covered with the liquid and solid particles could not stick to the inner wall, and are effectively evacuated.

However, a liquid with low viscosity can also be used even when supplied continuously, although the supply amount may be somewhat increased.

Water is one of the suitable liquids for the present invention. Water is most easily handled and very cheap, and can be treated easily after wasted. And when an interface activator such as a kitchen or industrial detergent on the market (for example, SHOKO Co.'s Kurihn Ehsu S (Trade Mark) (Clean Ace S), SHARP SYSTEM PRODUCTS Co.'s Ekitai Senjohzai M-251L (Trade Mark) (Liquid Detergent M-251L), YUHO CHEMICAL Co.'s Kurihn Ruhm You Senjohzai CC-85 (Trade Mark) (DETERGENT FOR CLEAN ROOM CC-85), IUCHI Co.'s Pyua Sofuto PS (Trade Mark) (PURE SOFT PS), IUCHI Co.'s Senzai Burukurihn 90, Burukurihn 70, Resukon Ls (Trade Mark) (DETERGENT Blue Clean 90, Blue Clean 70, Ls Con Ls)) is added to water, the water becomes outstandingly easy to wet the solid particles and/or the inner wall of the reactor vessel. Consequently, the solid particles are easily and quickly captured without flicked away by the water surface. Additionally, the inner wall surface of the reactor vessel becomes also easy to be wetted and solid particle layer is very effectively eliminated.

Among low viscosity liquids, there are fluorine family inert liquids, and the like on the market (for example, Sumitomo 3M Co.'s Furorinahto (FLUORINERT) (Registered Trade Mark)). And silicone oil family (for example, Toshiba's SILICONE OILS of TSF 458, 451 series, 405 and 431, and YF33 (Trade Mark)) can be adopted depending on the purpose, since one with preferred viscosity can be easily obtained in a wide range (for example a viscosity of 10 CST to 500000 CST is available for TSF 451 series).

Anyhow, the liquid should be preferably as inert as possible to the reactant gas, but also it should be of no trouble for the characteristics of the product.

As mentioned above, the inner wall had better be as hydrophilic as possible to be wetted by the liquid. Then the inner wall of the reactor vessel may be treated to be hydrophilic. The inner wall can be hydrophilic or easy to be wetted by being of frosted glass, lined with glass fibers or glass fiber cloth and the like or scored with vertical stripes. The glass fiber cloth may preferably be woven using fibers of hundred to several hundreds micron-meter in diameter.

As described above, the liquid should be basically as inert as possible to the reactant gas, but on the contrary alkaline liquid sometimes improves the process in case that a by-product from reaction is acid. It is because the by-product reacts to the liquid, that is, the liquid plays a role of waste gas treatment. In a typical case that reactant gases are $C_2H_4 + 2CHCl_3$, $$C_2H_4 + 2CHCl_3 \rightarrow 4C(s) + 6HCl \uparrow$$

the generated hydrogen chloride (HCl) gas is absorbed by the liquid, resulting in accelerating the reaction. Consequently, a yield rate per unit of reactant gas is improved and consumption of the reactant gas can be reduced. Examples of alkaline liquid are aforementioned Liquid Detergent M-251L, DETERGENT FOR CLEAN ROOM CC-85, PURE SOFT PS, DETERGENT Blue Clean 90, Blue Clean 70, and Ls Con Ls.

Further by flowing a liquid temperature-controlled by a thermo-controller 90, or thermally controlling the reactor vessel to cool the reactor vessel to decrease the temperature of a gas, the generation of the particle can be suppressed. By cooling the reactor vessel with liquid, the temperature gradient is caused between a high temperature optical fiber and a low temperature reactor vessel and as the result the particles generated in the reactor vessel have tendency to approach the inner wall of the reactor vessel by Thermophoresis effect caused by the temperature gradient. Therefore, the attack to the optical fiber can be prevented.

Using the removal by the liquid according to the present invention as described above, a coating process in a long period of time is possible since no solid particles deposit on the inner wall of the reactor vessel or if any it can be minimized. Examples are presented as follows.

EXAMPLE 1

This example 1 was obtained by a method according to the prior art. With reactant gases of $C_2H_4$ and $CHCl_3$, and a $CHCl_3$ carrier gas of He, a quartz fiber was coated with carbon. Nitrogen gas $N_2$ was used as a upper seal gas, and air as a lower seal gas. Respective amounts of gases were set at as the following.
$C_2H_4$: 100 cc/min
$CHCl_3$: 140 cc/min
Upper seal gas: 3.0 liter/min
Lower seal gas: 8.0 liter/min
Fiber drawing speed: 200 m/min.

Where "cc" stands for cubic centimeter, "min" is minute and "m" is meter.

Without supplying the liquid, the fiber was coated about 60 km in length for about 5 hours. The enormously big amount of carbon particles deposited on the inner wall of the reactor vessel especially at the lower half. Eventually effective discharge of the waste gas could not be performed.

EXAMPLE 2

This example 2 was obtained by a method according to the present invention. A fiber was drawn and carbon-coated in the same conditions as in Example 1, in the reaction apparatus as shown in FIG. 1 using a fluorine family inert liquid without hydrogen and chlorine as the liquid. The liquid has kinetic viscosity of 13 cSt at ambient temperature and boiling temperature of about 200 degrees Celsius. The liquid was supplied intermittently at flow rate of 300 cc/min for one minute every 10 minutes. This ten minute cycle was repeated. The waste liquid was treated in the waste liquid treating apparatus 12, wherein filtering process was included. The treated liquid was recycled to the reactor vessel. Under the above described conditions, the fiber coating was continued for about 8 hours and about 100 km in length. Only a little particles remained in the reactor vessel after the operation, and a further coating operation had been possible.

EXAMPLE 3

This example 3 was obtained by a method according to the present invention. A fiber was drawn and carbon-coated in the same conditions as in Test 2, except that the liquid was silicone family oil with kinetic viscosity of about 100 cSt and supplied continuously at flow rate of 1 cc/min.

During the coating operation of this test, no particles deposited on the inner wall at all for about 8 hours and about 100 km in length since the inner wall was always wet. The reactor was kept transparent all through the experiments.

EXAMPLE 4

This example 4 was obtained by a method according to the present invention. A fiber was drawn and carbon-coated in the same conditions as in Test 2 concerning the gas flow. Fiber drawing speed was 500 m/min. The fiber was drawn and coated for about 4 hours and about 120 km in length. In this Example, a reaction apparatus as shown in FIG. 3 was used. The liquid was water wherein a neutral liquid detergent on the market was added with volume ratio 10 cc of detergent per 1 liter of water. The liquid was continuously supplied by a displacement pump 14 at flow rate of 20 cc/min. The waste liquid containing the solid particles was neutralized and filtered in the waste liquid treating apparatus 12, and recycled as the liquid. As a result, no carbon particle deposit was recognized at all on the inner wall just as in Test 3. The physical properties and anti-hydrogen property of the carbon coating optical fiber was uniform and stable all through the fiber length.

EXAMPLE 5

This example 5 was obtained by a method according to the present invention. A fiber was drawn and carbon-coated in the same conditions as in Example 2, in the reaction apparatus as shown in FIG. 3. The reactor vessel is constructed as a dual pipe. The pressure of the outer pipe 22 was set lower than that of the inner pipe 21 in order to let the gas flow from inside to outside at all times. The outer pipe 22 forms a path for the waste. Since with this kind of construction an atmosphere in the outer pipe affects little that in the inner pipe (reaction area), there is an advantage that an atmosphere in the outer pipe can be determined relatively freely. However, a certain amount of particles deposit on the inner pipe wall inevitably. The common reference numerals to FIG. 3 and FIG. 1 denote the same kind of parts in the both drawings, and 61 denotes a waste discharge port and 62 denotes a waste gas discharge path.

A synthetic lubricant with kinetic viscosity of about 15 cSt was used as the liquid. The liquid was supplied continuously at flow rate of 3 cc/min. The outside of the outer pipe was cooled to keep the temperature at 80° C., with water (not shown in the drawing).

The result shows that no deposit was recognized in the reactor after coating operation for about 8 hours and about 100 km, the same as in the Example 3.

The reactor wall tends to be heated by a coating reaction, and the liquid flowing on the wall may generate vapor due to the heat. Therefore, it is good to cool the wall, in order to keep a stable operation and not for the vapor to affect the fiber adversely.

In the aforementioned embodiments, coating material is carbon, but the present invention can work with the other materials such as $TiO_2$, TiN, $Si_3N_4$, SiC or TiC.

As described above, the present invention enables a long time and continuous hermetic coating, and contributes to improving the productivity.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. An apparatus for manufacturing a hermetically coated optical fiber comprising:
    a reactor;
    a reactant gas introducing means connected to the reactor for introducing a reactant gas into said reactor; and
    liquid flowing means connected to said reactor for flowing a liquid along an inner wall of said reactor, whereby material derived from the reactant gas is hermetically coated on an optical fiber passing through said reactor by chemical reaction.

2. An apparatus according to claim 1, wherein said liquid flowing means comprises a liquid inlet port for introducing the liquid along the inside of said reactor, and a reservoir means for temporarily storing the liquid and substantially uniformly supplying the temporarily stored liquid along said inner wall of said reactor.

3. An apparatus according to claim 2, wherein said reservoir means comprises a weir, said weir being adapted to cause the temporarily stored liquid to flow out over said weir to said inner wall of said reactor.

4. An apparatus according to claim 1, further comprising distributing means provided on said inner wall of said reactor for re-distributing the liquid flowing on said inner wall to supply the liquid along the periphery of the inner wall which is below said distributing means.

5. An apparatus according to claim 2, further comprising second reservoir means provided below said reservoir means and on said inner wall for temporarily storing the liquid flowing along said inner wall from said reservoir, and for supplying the liquid temporarily stored in said second reservoir along said inner wall of said reactor.

6. An apparatus for manufacturing a hermetically coated optical fiber comprising:
a reactor vessel;
an upper seal gas inlet port provided at a top part of the reactor vessel;
a reactant gas inlet port provided below the upper seal gas inlet port;
a reservoir provided below the reactant gas inlet port;
a liquid inlet port connected to the reservoir;
a weir for causing the liquid in the reservoir to overflow thereover to the inner wall;
a lower seal gas inlet port provided at a bottom part of the reactor vessel;
a waste gas discharge port provided at a bottom part of the reactor vessel;
a waste gas treating apparatus connected to the waste gas discharge port;
a waste liquid discharge port provided at a bottom part of the reactor vessel;
a waste liquid treating apparatus connected to the waste liquid discharge port; and
the reactor vessel being constructed so that an optical fiber passes through the reactor vessel.

7. An apparatus according to claim 6, wherein a top edge of the weir is indented like saw teeth.

8. An apparatus according to claim 6, wherein a hole is opened at the bottom of the weir.

9. An apparatus for manufacturing a hermetically coated optical fiber comprising:
a reactor vessel;
an upper seal gas inlet port provided at a top part of the reactor vessel;
a reservoir provided below the upper seal gas inlet port, the reservoir having a bottom plate and a fiber protective pipe, the bottom plate having a hole through which liquid temporarily stored in the reservoir flows out to the reactor vessel;
a liquid inlet port connected to the reservoir;
a reactant gas inlet port provided below the reservoir;
a lower seal gas inlet port provided at a bottom part of the reactor vessel;
a waste gas discharge port provided at a bottom part of the reactor vessel;
a waste gas liquid treating apparatus connected to the waste gas discharge port;
a waste liquid discharge port provided at a bottom part of the reactor vessel;
a waste liquid treating apparatus connected to the waste liquid discharge port; and
the reactor vessel is constructed so that an optical fiber passes through the reactor vessel.

10. An apparatus according to in claim 9, wherein the reactant gas inlet port comprises a dual pipe, the reactant gas flowing through an upper path of the dual pipe and the liquid flowing through a lower path of the dual pipe.

11. An apparatus for manufacturing a hermetically coated optical fiber as recited in claim 9, wherein the bottom plate is formed separate from the reactor vessel, the bottom plate being rotatable relative to the reactor vessel.

12. An apparatus for manufacturing a hermetically coated optical fiber as recited in claim 9, wherein a means for redistributing the liquid is provided below the reservoir on the inner wall of the reactor vessel.

13. An apparatus for manufacturing a hermetically coated optical fiber as recited in claim 7, wherein a second reservoir is furnished below the reservoir on the inner wall of the reactor vessel.

14. An apparatus for manufacturing a hermetically coated optical fiber as recited in claim 7, wherein a hole through which the liquid flows is provided below the reservoir on the inner wall of the reactor vessel.

15. An apparatus for manufacturing a hermetically coated optical fiber as recited in claim 6, which further comprises an inner pipe in the reactor vessel, a top part of the inner pipe being connected to the reactor vessel above the reservoir and a bottom part of the inner pipe being connected to the reactor vessel at the bottom part of the reactor vessel.

16. An apparatus for manufacturing a hermetically coated optical fiber as recited in claim 6, which further comprises a circulating path for recycling a liquid treated in the waste liquid treating apparatus the circulating path being provided between and connecting the waste liquid treating apparatus and the liquid inlet port.

17. An apparatus for manufacturing a hermetically coated optical fiber as recited in claim 6, which further comprises a cooling apparatus for cooling an outside of the reactor vessel.

18. An apparatus for manufacturing a hermetically coated optical fiber as recited in claim 6, wherein the inner wall of the reactor vessel is treated to be hydrophilic.

19. An apparatus according to claim 1, further comprising a thermal-controller for controlling a temperature of said liquid to be supplied to said inner wall of said reactor.

* * * * *